United States Patent
Manola

(10) Patent No.: US 10,461,709 B2
(45) Date of Patent: Oct. 29, 2019

(54) AMPLIFIER WITH AUXILIARY PATH FOR MAXIMIZING POWER SUPPLY REJECTION RATIO

(71) Applicant: Cirrus Logic International Semiconductor Ltd., Edinburgh (GB)

(72) Inventor: Bhupendra Singh Manola, Austin, TX (US)

(73) Assignee: Cirrus Logic, Inc., Austin, TX (US)

( * ) Notice: Subject to any disclaimer, the term of this patent is extended or adjusted under 35 U.S.C. 154(b) by 82 days.

(21) Appl. No.: 15/394,168

(22) Filed: Dec. 29, 2016

(65) Prior Publication Data

US 2018/0191320 A1    Jul. 5, 2018

(51) Int. Cl.
  *H03F 3/45*    (2006.01)
  *H03F 3/185*    (2006.01)
  (Continued)

(52) U.S. Cl.
  CPC ....... *H03F 3/45636* (2013.01); *H03F 1/0216* (2013.01); *H03F 1/14* (2013.01);
  (Continued)

(58) Field of Classification Search
  CPC ...... H03F 3/45636; H03F 1/0216; H03F 1/26; H03F 3/185; H03F 3/21; H03F 3/45273; H03F 2200/03; H03F 2200/555; H03F 2203/45632; H03F 1/14; H03F 1/301; H03F 2200/135; H03F 2200/18; H03F 2200/372; H03F 2200/408; H03F 2200/453; H03F 2200/459; H04R 3/02; H04R 2460/03
  (Continued)

(56) References Cited

U.S. PATENT DOCUMENTS 3,851,269 A    11/1974    Szorc
5,963,101 A  *  10/1999    Iravani ..................... H03K 3/03
                                                                327/280
(Continued)

FOREIGN PATENT DOCUMENTS

EP    1367704 A2    12/2003
GB    2510395 A    8/2014
(Continued)

OTHER PUBLICATIONS

Combined Search and Examination Report under Sections 17 and 18(3) of the UKIPO, Application No. GB1701269.1, dated Jul. 7, 2017.
(Continued)

*Primary Examiner* — Vivian C Chin
*Assistant Examiner* — Con P Tran
(74) *Attorney, Agent, or Firm* — Jackson Walker L.L.P.

(57) ABSTRACT

An amplifier may include a main signal path having a plurality of stages compensated by feedback elements, the plurality of stages comprising an output stage configured to receive electrical energy from a power supply and an auxiliary path independent of the main signal path and comprising an output stage compensation circuit configured to generate a compensation current proportional to noise present in the power supply and apply the compensation current to cancel a power supply-induced current present in at least one of the feedback elements.

21 Claims, 3 Drawing Sheets

(51) Int. Cl.
  *H03F 1/26* (2006.01)
  *H03F 1/02* (2006.01)
  *H03F 3/21* (2006.01)
  *H04R 3/02* (2006.01)
  *H03F 1/14* (2006.01)
  *H03F 1/30* (2006.01)

(52) U.S. Cl.
  CPC .............. *H03F 1/26* (2013.01); *H03F 1/301* (2013.01); *H03F 3/185* (2013.01); *H03F 3/21* (2013.01); *H03F 3/45273* (2013.01); *H04R 3/02* (2013.01); *H03F 2200/03* (2013.01); *H03F 2200/135* (2013.01); *H03F 2200/18* (2013.01); *H03F 2200/372* (2013.01); *H03F 2200/408* (2013.01); *H03F 2200/453* (2013.01); *H03F 2200/459* (2013.01); *H03F 2200/555* (2013.01); *H03F 2203/45632* (2013.01); *H04R 2460/03* (2013.01)

(58) Field of Classification Search
  USPC ....... 381/121, 120, 94.5, 94.6, 94.1; 330/76, 330/75, 290, 127, 149, 257, 288, 177
  See application file for complete search history.

(56) References Cited

U.S. PATENT DOCUMENTS

| | | |
|---|---|---|
| 6,348,781 B1 | 2/2002 | Midya et al. |
| 6,617,908 B1 | 9/2003 | Thomsen et al. |
| 6,727,752 B2 | 4/2004 | Skinner et al. |
| 7,084,799 B1 | 8/2006 | Butler |
| 7,265,524 B2 | 9/2007 | Jordan et al. |
| 7,466,194 B2 | 12/2008 | Mazda et al. |
| 8,242,847 B1 | 8/2012 | Leong et al. |
| 8,638,168 B1 | 1/2014 | Signoff et al. |
| 8,773,196 B2 | 7/2014 | Delano |
| 9,088,211 B2 | 7/2015 | Ivanov et al. |
| 9,628,033 B2 | 4/2017 | King et al. |
| 9,647,611 B1 | 5/2017 | Embar et al. |
| 2003/0122615 A1 | 7/2003 | Zeff |
| 2003/0222713 A1 | 12/2003 | Skinner et al. |
| 2004/0169552 A1 | 9/2004 | Butler |
| 2005/0013447 A1* | 1/2005 | Crump .................. H02M 3/156 381/71.6 |
| 2005/0083115 A1 | 4/2005 | Risbo |
| 2007/0229332 A1 | 10/2007 | Tsividis |
| 2008/0111622 A1 | 5/2008 | Sperlich et al. |
| 2008/0310046 A1 | 12/2008 | Menegoli et al. |
| 2009/0027247 A1 | 1/2009 | Kumamoto et al. |
| 2009/0212859 A1 | 8/2009 | Lesso et al. |
| 2010/0214024 A1 | 8/2010 | Jones et al. |
| 2010/0237941 A1 | 9/2010 | Goldfarb et al. |
| 2012/0139639 A1 | 6/2012 | Scott et al. |
| 2012/0293217 A1 | 11/2012 | Ginsburg et al. |
| 2012/0306575 A1 | 12/2012 | Shah et al. |
| 2013/0002359 A1 | 1/2013 | Dhanasekaran |
| 2014/0028395 A1 | 1/2014 | Chan et al. |
| 2014/0247035 A1* | 9/2014 | Gupta ....................... G05F 3/02 323/315 |
| 2015/0071464 A1 | 3/2015 | Du et al. |
| 2015/0097541 A1* | 4/2015 | Banag ....................... G05F 1/46 323/281 |
| 2015/0222184 A1 | 8/2015 | Melanson et al. |
| 2015/0323947 A1 | 11/2015 | Amadi et al. |
| 2016/0056707 A1 | 2/2016 | Wong et al. |
| 2017/0207755 A1 | 7/2017 | He et al. |
| 2017/0207759 A1 | 7/2017 | He et al. |
| 2017/0271996 A1 | 9/2017 | King et al. |
| 2017/0272043 A1 | 9/2017 | King et al. |
| 2017/0272044 A1 | 9/2017 | Melanson et al. |

FOREIGN PATENT DOCUMENTS

| | | |
|---|---|---|
| GB | 2546576 A | 7/2017 |
| JP | S59224905 A | 12/1984 |
| NO | 2017127132 A1 | 7/2017 |
| NO | 2017127353 A1 | 7/2017 |
| WO | 98/57422 A1 | 12/1998 |
| WO | 2007136800 A2 | 11/2007 |
| WO | 2016/160326 A1 | 10/2016 |
| WO | 2017160520 A1 | 9/2017 |
| WO | 2017160522 A1 | 9/2017 |
| WO | 2017160556 A1 | 9/2017 |

OTHER PUBLICATIONS

Combined Search and Examination Report under Sections 17 and 18(3) of the UKIPO, Application No. GB1703492.7, dated Aug. 31, 2017.
Combined Search and Examination Report under Sections 17 and 18(3) of the UKIPO, Application No. GB1703865.4, dated Aug. 31, 2017.
International Search Report and Written Opinion of the International Searching Authority, International Application No. PCT/US2017/020911, dated Nov. 7, 2017.
Eynde, Frank O. On the relationship between the CMRR or PSRR and the second harmonic distortion of differential input amplifiers, IEEE Journal of Solid-State Circuits, vol. 24, Issue: 6, Dec. 1989, pp. 1740-1744.
International Search Report and Written Opinion of the International Searching Authority, International Patent Application No. PCT/US2016/040072, dated Sep. 16, 2016.
Combined Search Report and Written Opinion, GB Application No. 1617096.1, dated Apr. 7, 2017.
Search Report, GB Application No. 1619679.2, dated Apr. 28, 2017.
International Search Report and Written Opinion of the International Searching Authority, International Patent Application No. PCT/US2017/020927, dated May 26, 2017.
International Search Report and Written Opinion of the International Searching Authority, International Patent Application No. PCT/US2017/021351, dated May 26, 2017.
International Search Report and Written Opinion of the International Searching Authority, International Patent Application No. PCT/US2017/013756, dated May 30, 2017.
International Search Report and Written Opinion of the International Searching Authority, International Application No. PCT/US2017/068153, dated Jun. 11, 2018.

* cited by examiner

AMPLIFIER WITH AUXILIARY PATH FOR MAXIMIZING POWER SUPPLY REJECTION RATIO

FIELD OF DISCLOSURE

The present disclosure relates in general to circuits for audio devices, including without limitation personal audio devices such as wireless telephones and media players, and more specifically, to an amplifier with an auxiliary path for maximizing the power supply rejection ratio of the amplifier.

BACKGROUND

Personal audio devices, including wireless telephones, such as mobile/cellular telephones, cordless telephones, mp3 players, and other consumer audio devices, are in widespread use. Such personal audio devices may include circuitry for driving a pair of headphones or one or more speakers. Such circuitry often includes a power amplifier for driving an audio output signal to headphones or speakers. Oftentimes, such power amplifier is implemented using a transconductance with capacitances feedback compensation (TCFC) amplifier.

In many instances, power supplies used to provide electrical energy to amplifiers may be noisy, including having significant high-frequency noise (e.g. mid-band noise in the range of 100 KHz to 1 MHz). In many traditional approaches, such high-frequency noise may mix with out-of-band noise (e.g., quantization noise of a delta-sigma modulator used to implement a data converter) and fall within the audio band. Poor power supply rejection ratio at such frequencies may result in variation of an input signal to be amplified in order to compensate for noise-induced current, and such supply-induced noise at the input may mix with incoming high-frequency noise (e.g., modulator-shaped quantization noise), and may fold in-band, this raising a noise floor and degrading dynamic range of an audio system.

SUMMARY

In accordance with the teachings of the present disclosure, one or more disadvantages and problems associated with existing approaches to design of amplifiers may be reduced or eliminated.

In accordance with embodiments of the present disclosure, an amplifier may include a main signal path having a plurality of stages compensated by feedback elements, the plurality of stages comprising an output stage configured to receive electrical energy from a power supply and an auxiliary path independent of the main signal path and comprising an output stage compensation circuit configured to generate a compensation current proportional to noise present in the power supply and apply the compensation current to cancel a power supply-induced current present in at least one of the feedback elements.

In accordance with these and other embodiments of the present disclosure, a personal audio device may comprise an audio transducer configured to generate sound in accordance with an output signal received by the audio transducer and an amplifier for generating the output signal. The amplifier may include a main signal path having a plurality of stages compensated by feedback elements, the plurality of stages comprising an output stage configured to receive electrical energy from a power supply and an auxiliary path independent of the main signal path and comprising an output stage compensation circuit configured to generate a compensation current proportional to noise present in the power supply and apply the compensation current to cancel a power supply-induced current present in at least one of the feedback elements.

In accordance with these and other embodiments of the present disclosure, a method may include an amplifier with a main signal path having a plurality of stages compensated by feedback elements, the plurality of stages comprising an output stage configured to receive electrical energy from a power supply: (i) generating a compensation current proportional to noise present in the power supply; and (ii) applying the compensation current to cancel a power supply-induced current present in at least one of the feedback elements.

Technical advantages of the present disclosure may be readily apparent to one skilled in the art from the figures, description and claims included herein. The objects and advantages of the embodiments will be realized and achieved at least by the elements, features, and combinations particularly pointed out in the claims.

It is to be understood that both the foregoing general description and the following detailed description are examples and explanatory and are not restrictive of the claims set forth in this disclosure.

BRIEF DESCRIPTION OF THE DRAWINGS

A more complete understanding of the present embodiments and advantages thereof may be acquired by referring to the following description taken in conjunction with the accompanying drawings, in which like reference numbers indicate like features, and wherein.

DETAILED DESCRIPTION

In accordance with embodiments of the present disclosure, an integrated circuit for use in an audio device, such as a personal audio device (e.g., mobile telephone, portable music player, tablet computer, personal digital assistant, etc.), may include a signal path having a digital path portion (e.g., an audio compressor) and an analog path portion (e.g., an audio expander). The analog path portion may include a TCFC amplifier to receive an analog signal generated by the digital path portion and apply a gain to the analog signal to generate an output signal, wherein said output signal may be communicated to a loudspeaker for playback and/or to other circuitry for processing.

Figure 1:
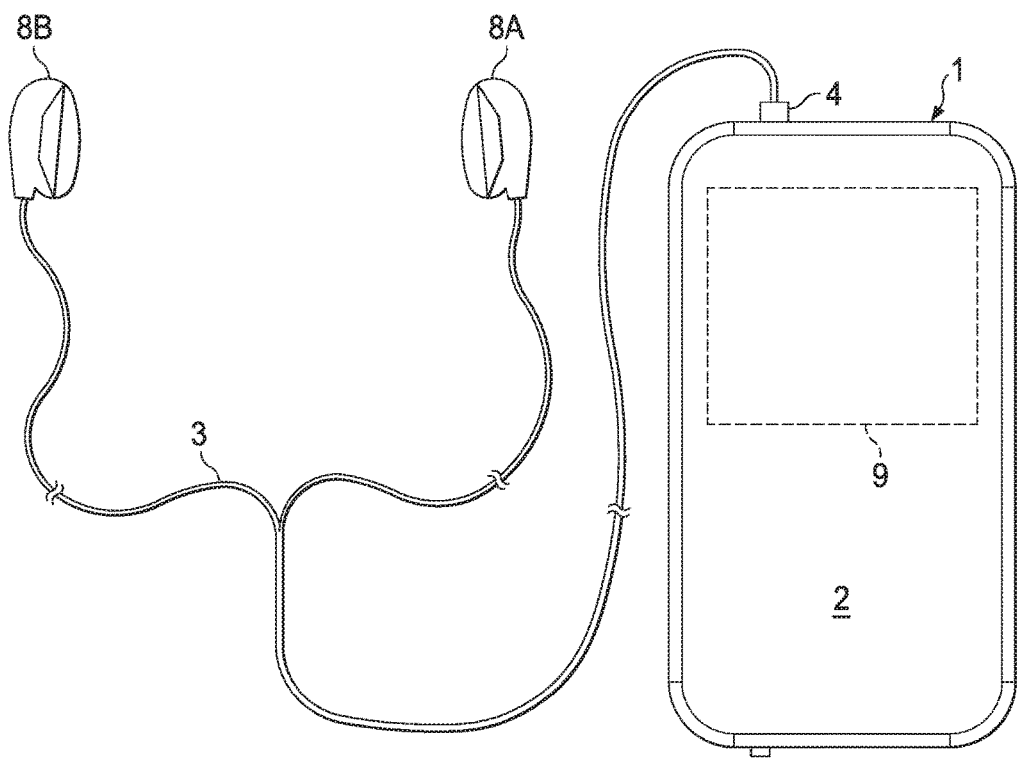
FIG. 1 is an illustration of an example personal audio device, in accordance with embodiments of the present disclosure.

The integrated circuit described above may be used in any suitable system, device, or apparatus, including without limitation, a personal audio device. FIG. 1 is an illustration of an example personal audio device 1, in accordance with embodiments of the present disclosure. FIG. 1 depicts personal audio device 1 coupled to a headset 3 in the form of a pair of earbud speakers 8A and 8B. Headset 3 depicted in FIG. 1 is merely an example, and it is understood that personal audio device 1 may be used in connection with a variety of audio transducers, including without limitation, headphones, earbuds, in-ear earphones, and external speakers. A plug 4 may provide for connection of headset 3 to an electrical terminal of personal audio device 1. Personal audio device 1 may provide a display to a user and receive user input using a touch screen 2, or alternatively, a standard liquid crystal display (LCD) may be combined with various buttons, sliders, and/or dials disposed on the face and/or sides of personal audio device 1. As also shown in FIG. 1, personal audio device 1 may include an audio integrated circuit (IC) 9 for generating an analog audio signal for transmission to headset 3 and/or another audio transducer.

Figure 2:
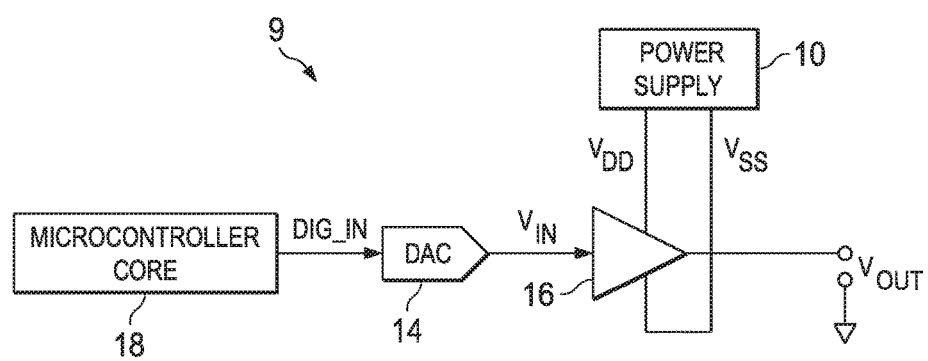
FIG. 2 is a block diagram of selected components of an example audio integrated circuit of a personal audio device, in accordance with embodiments of the present disclosure.

FIG. 2 is a block diagram of selected components of an example audio IC 9 of a personal audio device, in accordance with embodiments of the present disclosure. As shown in FIG. 2, a microcontroller core 18 may supply a digital audio input signal DIG_IN to a digital-to-analog converter (DAC) 14, which may convert the digital audio input signal to an analog signal $V_{IN}$. DAC 14 may be referred to herein as a digital path portion of the signal path from the input node for digital audio input signal DIG_IN to the output node for output voltage signal $V_{OUT}$ depicted in FIG. 2.

DAC 14 may supply analog signal $V_{IN}$ to an amplifier stage 16 which may amplify or attenuate audio input signal $V_{IN}$ in conformity with a gain to provide an audio output signal $V_{OUT}$, which may operate a speaker, headphone transducer, a line level signal output, and/or other suitable output. In the relevant art, amplifier stage 16 may sometimes be referred to as an audio expander. In some embodiments, amplifier stage 16 may comprise a TCFC amplifier, such as TCFC amplifier 30 shown in FIG. 3. A power supply 10 may provide the power supply rail inputs $V_{DD}$ and $V_{SS}$ of amplifier stage 16. In some embodiments, such power supply 10 may be an on-chip charge pump with significant noise in a mid-band frequency range (e.g., 100 KHz-1MHz).

Figure 3:
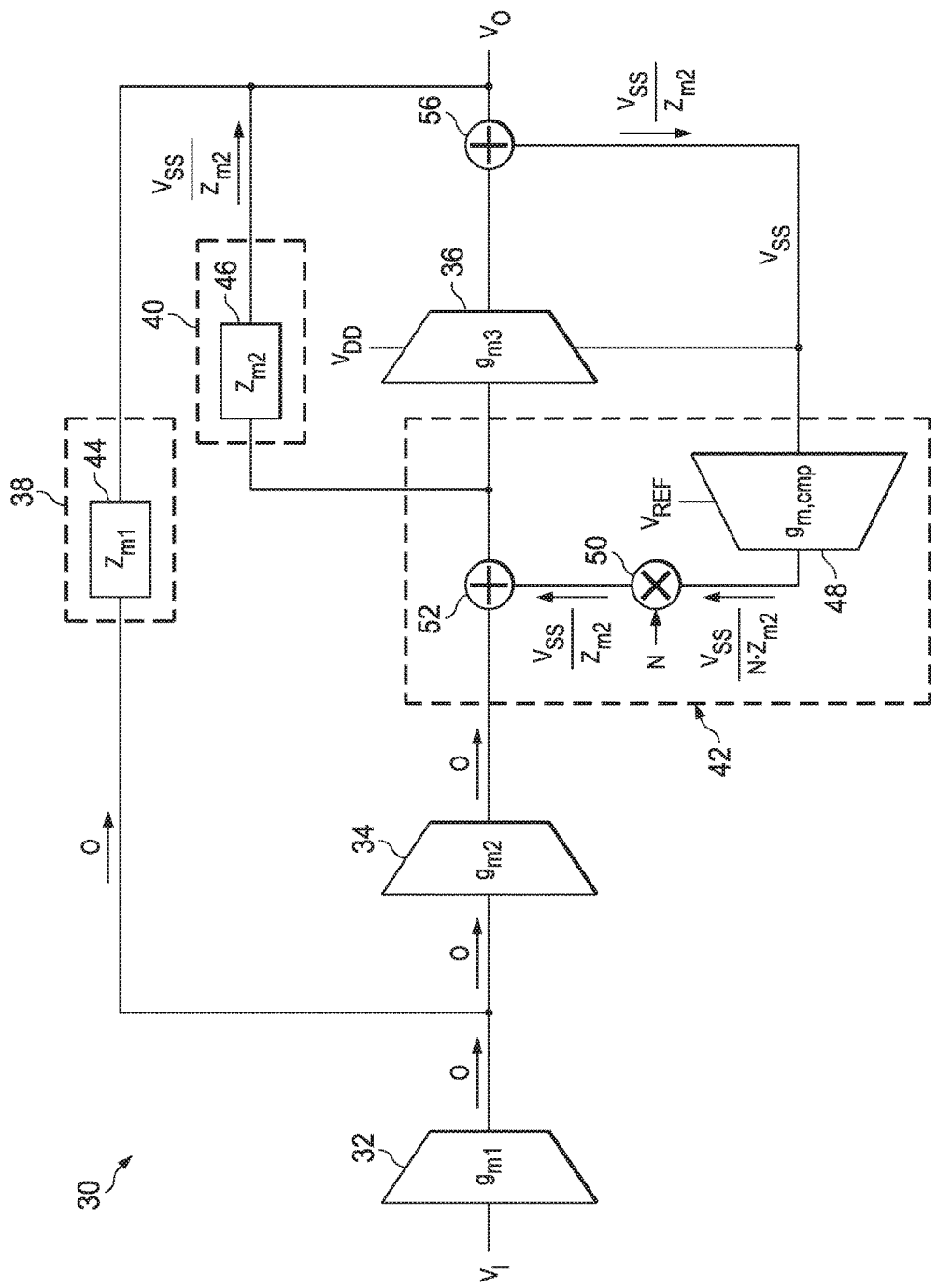
FIG. 3 is a block diagram of selected components of a transconductances with feedback capacitances (TCFC) amplifier for use in the audio integrated circuit of FIG. 2, in accordance with embodiments of the present disclosure.

FIG. 3 is a block diagram of selected components of a TCFC amplifier 30 which may be used as or as part of amplifier stage 16 of audio IC 9, in accordance with embodiments of the present disclosure. As shown in FIG. 3, TCFC amplifier 30 may include a first gain stage 32, a second gain stage 34, a third gain stage 36, an outer feedback loop 38, an inner feedback loop 40, and an auxiliary path 42 which includes a current compensation circuit.

First gain stage 32 may have a first gain stage input and a first gain stage output and may be configured to receive an input signal $V_I$ at the first gain stage input and apply a first gain $g_{m1}$ to input signal $V_I$ to generate a first gain stage output signal at the first gain stage output. When TCFC amplifier 30 is used as or as part of amplifier stage 16 of FIG. 2, input signal $V_I$ may be analog signal $V_{IN}$ or a derivative thereof. In some embodiments, first gain stage 32 may be implemented as an operational amplifier. In these and other embodiments, first gain $g_{m1}$ may comprise a non-inverting gain. In these and other embodiments, gain $g_{m1}$ may comprise a transconductance gain.

Second gain stage 34 may have a second gain stage input and a second gain stage output and may be configured to receive the first gain stage output signal at the second gain stage input and apply a second gain $g_{m2}$ to the first gain stage output signal to generate a second gain stage output signal at the second gain stage output. In some embodiments, second gain stage 34 may be implemented as an operational amplifier. In these and other embodiments, second gain $g_{m2}$ may comprise a non-inverting gain. In these and other embodiments, gain $g_{m2}$ may comprise a transconductance gain.

Third gain stage 36 may have a third gain stage input and a third gain stage output and may be configured to receive the second gain stage output signal at the third gain stage input and apply a third gain to the second gain stage output signal to generate a third gain stage output signal $V_O$ at the third gain stage output. When TCFC amplifier 30 is used as or as part of amplifier stage 16 of FIG. 2, audio output signal $V_{OUT}$ may be third gain stage output signal $V_O$ or a derivative thereof. In some embodiments, third gain stage 36 may be implemented as an operational amplifier. In these and other embodiments, third gain $g_{m3}$ may comprise an inverting gain. In these and other embodiments, gain $g_{m3}$ may comprise a transconductance gain.

Outer feedback loop 38 may include an impedance 44 (e.g., with impedance $Z_{m1}$) coupled between the second gain stage input and the third gain stage output. Inner feedback loop 40 may be coupled between the third gain stage input and the third gain stage output and may include an impedance 46 (e.g., with impedance $Z_{m2}$) configured to provide cascade compensation between the third gain stage input and the third gain stage output.

Auxiliary path 42 may be independent of the main signal path comprising gain stages 32, 34, and 36 and may include (as described in greater detail below) an output stage compensation circuit configured to generate a compensation current proportional to noise present in the power supply and apply the compensation current to cancel a power supply-induced current present in at least one of the feedback impedances of TCFC amplifier 30 (e.g., one or both of impedances 44 and 46). As shown in FIG. 3, auxiliary path 42 may include a gain stage 48 configured to receive rail voltage $V_{SS}$ and apply a transconductance gain $g_{m,cmp}=1/(N \cdot Z_{m2})$ to rail voltage $V_{SS}$ in order to generate a current $V_{SS}/(N \cdot Z_{m2})$ at the output of gain stage 48. The value N may be a unitless factor accounting for impedance differences (e.g., differences in capacitances used to implement impedance 46 and gain stage 48, as described in greater detail below). As also depicted in FIG. 3, gain stage 48 of auxiliary path 42 may be coupled to a voltage reference $V_{REF}$ with significantly less noise than the power supply (e.g., power supply 10) supplying rail voltage $V_{SS}$ and having significantly less impedance than such power supply. In some embodiments, voltage reference $V_{REF}$ may be a ground voltage approximately equal to rail voltage $V_{SS}$, but with significantly less noise and impedance than the power supply supplying rail voltage $V_{SS}$.

A gain stage 50 may apply the factor N to the output of gain stage 48, generating a current $V_{SS}/Z_{m2}$ that is combined by combiner 52 with the output of second gain stage 34, which compensates for a current flowing through impedance 46 of inner feedback loop 40.

Thus, by application of auxiliary path 42, current through impedance 46 which is induced by noise of rail voltage $V_{SS}$ is compensated by the compensation circuit of auxiliary path 42, instead of the main signal path of TCFC amplifier 30, as indicated by zero currents depicted in FIG. 3.

For the purposes of exposition and clarity, FIG. 3 depicts an auxiliary path 42 with a current compensation circuit for compensating for power supply noise present in rail voltage $V_{SS}$. Those of skill in the art should recognize that an auxiliary path which is a dual of auxiliary path depicted in FIG. 3 may be used to provide a current compensation circuit for compensating for power supply noise present in rail voltage $V_{DD}$.

Figure 4:
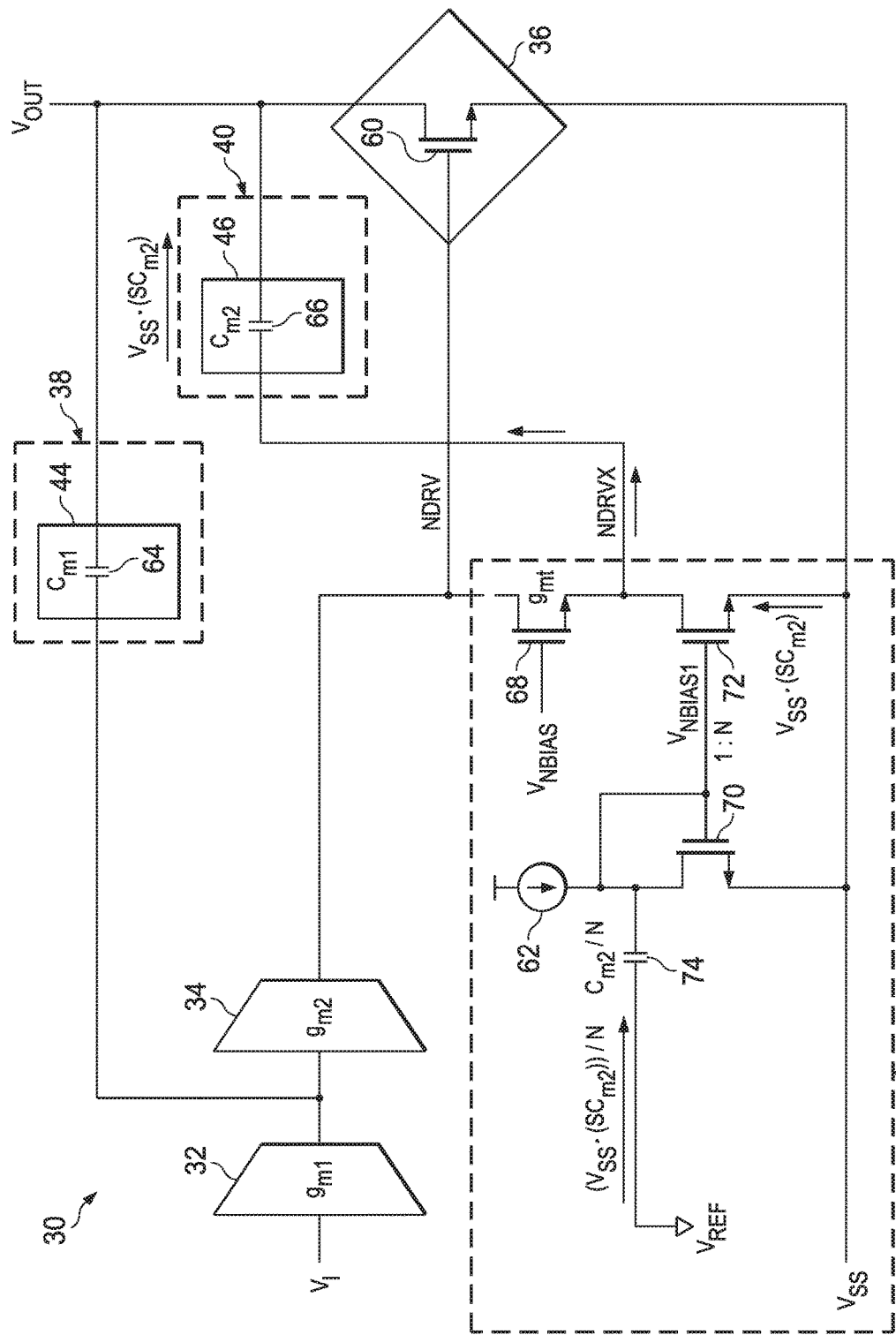
FIG. 4 is a block diagram of selected components of particular implementations of the TCFC amplifier of FIG. 3, in accordance with embodiments of the present disclosure.

FIG. 4 is a block diagram of selected components of particular implementations of TCFC 30 amplifier of FIG. 3, in accordance with embodiments of the present disclosure. In particular, FIG. 4 shows an implementation of a low-side driver (or N-side driver) portion of TCFC amplifier 30 to compensate for power supply noise on rail voltage $V_{SS}$. Those of skill in the art should recognize that a dual of the low-side driver portion of TCFC amplifier 30 may be used to provide a current compensation circuit for a high-side driver (or P-side driver) of TCFC amplifier 30 which compensates for power supply noise present in rail voltage $V_{DD}$.

As shown in FIG. 4, impedance 44 may be implemented as a capacitor 64 with capacitance $C_{m1}$, impedance 46 may be implemented as a capacitor 66 with capacitance $C_{m2}$, and third gain stage 36 may be implemented with a transistor 60. In addition, auxiliary path 42 may be implemented with a biasing circuit and a capacitor 74. The biasing circuit may be operable to current bias third stage 36 of TCFC amplifier 30 and may comprise a transistor 68 that forms a transconductance $g_{mt}$ and a current mirror including a current source 62 and transistors 70 and 72, wherein the current mirror may generate a bias current for current biasing third stage 36. Capacitor 74 may be coupled between the current mirror and the low-noise, low-impedance voltage reference $V_{REF}$. In some embodiments, capacitor 74 may be proportional to one of the feedback capacitances of TCFC amplifier 30 (e.g., capacitor 66). In such embodiments, the current mirror may have a ratio substantially equal to that of the ratio N of capacitance $C_{m2}$ to the capacitance $C_{m2}/N$ of capacitor 74.

Although FIGS. 3 and 4 depict a TCFC amplifier 30 as an example of amplifier 16 may be implemented in any suitable architecture (e.g., TCFC, three-stage nested Miller amplifier, etc.), and the systems and methods described herein may be applied in general to any suitable amplifier architecture in order to maximize power supply rejection ratio.

This disclosure encompasses all changes, substitutions, variations, alterations, and modifications to the exemplary embodiments herein that a person having ordinary skill in the art would comprehend. Similarly, where appropriate, the appended claims encompass all changes, substitutions, variations, alterations, and modifications to the exemplary embodiments herein that a person having ordinary skill in the art would comprehend. Moreover, reference in the appended claims to an apparatus or system or a component of an apparatus or system being adapted to, arranged to, capable of, configured to, enabled to, operable to, or operative to perform a particular function encompasses that apparatus, system, or component, whether or not it or that particular function is activated, turned on, or unlocked, as long as that apparatus, system, or component is so adapted, arranged, capable, configured, enabled, operable, or operative.

All examples and conditional language recited herein are intended for pedagogical objects to aid the reader in understanding the invention and the concepts contributed by the inventor to furthering the art, and are construed as being without limitation to such specifically recited examples and conditions. Although embodiments of the present inventions have been described in detail, it should be understood that various changes, substitutions, and alterations could be made hereto without departing from the spirit and scope of the disclosure.

What is claimed is:

1. An amplifier, comprising:
 a main signal path having a plurality of stages compensated by feedback elements, the plurality of stages comprising an output stage configured to receive electrical energy from a power supply; and
 an auxiliary path independent of the main signal path and comprising an output stage compensation circuit configured to:
  generate a compensation current proportional to noise present in the power supply; and
  apply the compensation current to cancel a power supply-induced current present in at least one of the feedback elements.

2. The amplifier of claim 1, wherein the auxiliary path is coupled to a voltage reference with significantly less noise than the power supply and having significantly less impedance than the power supply.

3. The amplifier of claim 2, wherein the auxiliary path comprises:
 a biasing circuit for current biasing the output stage; and
 a capacitor coupled between the biasing circuit and the voltage reference.

4. The amplifier of claim 3, wherein:
 the feedback elements comprise a feedback capacitor; and
 a capacitance of the capacitor is proportional to a capacitance of the feedback capacitor.

5. The amplifier of claim 3, wherein the biasing circuit further comprises a current mirror generating a bias current for current biasing the output stage, wherein the current mirror is coupled to the capacitor.

6. The amplifier of claim 5, wherein:
 the feedback elements comprise a feedback capacitor; and
 the current mirror has a ratio substantially equal to that of the ratio of a capacitance of the feedback capacitor to a capacitance of the capacitor.

7. The amplifier of claim 1, wherein the feedback elements comprise at least one of a feedback transconductance and a feedback capacitance.

8. A personal audio device comprising:
 an audio transducer configured to generate sound in accordance with an output signal received by the audio transducer; and
 an amplifier for generating the output signal, comprising:
  a main signal path having a plurality of stages compensated by feedback elements, the plurality of stages comprising an output stage configured to receive electrical energy from a power supply; and
  an auxiliary path independent of the main signal path and comprising an output stage compensation circuit configured to:
   generate a compensation current proportional to noise present in the power supply; and
   apply the compensation current to cancel a power supply-induced current present in at least one of the feedback elements.

9. The personal audio device of claim 8, wherein the auxiliary path is coupled to a voltage reference with significantly less noise than the power supply and having significantly less impedance than the power supply.

10. The personal audio device of claim 9, wherein the auxiliary path comprises:
 a biasing circuit for current biasing the output stage; and
 a capacitor coupled between the biasing circuit and the voltage reference.

11. The personal audio device of claim 10, wherein:
 the feedback elements comprise a feedback capacitor; and
 a capacitance of the capacitor is proportional to a capacitance of the feedback capacitor.

12. The personal audio device of claim 10, wherein the biasing circuit further comprises a current mirror generating a bias current for current biasing the output stage, wherein the current mirror is coupled to the capacitor.

13. The personal audio device of claim 12, wherein:
the feedback elements comprise a feedback capacitor; and
the current mirror has a ratio substantially equal to that of the ratio of a capacitance of the feedback capacitor to a capacitance of the capacitor.

14. The personal audio device of claim 8, wherein the feedback elements comprise at least one of a feedback transconductance and a feedback capacitance.

15. A method comprising, in an amplifier with a main signal path having a plurality of stages compensated by feedback elements, the plurality of stages comprising an output stage configured to receive electrical energy from a power supply:
generating a compensation current proportional to noise present in the power supply; and
applying the compensation current to cancel a power supply-induced current present in at least one of the feedback elements.

16. The method of claim 15, further comprising generating the compensation current with an auxiliary path independent of the main signal path, wherein the auxiliary path is coupled to a voltage reference with significantly less noise than the power supply and having significantly less impedance than the power supply.

17. The method of claim 16, wherein the auxiliary path comprises:
a biasing circuit for current biasing the output stage; and
a capacitor coupled between the biasing circuit and the voltage reference.

18. The method of claim 17, wherein:
the feedback elements comprise a feedback capacitor; and
a capacitance of the capacitor is proportional to a capacitance of the feedback capacitor.

19. The method of claim 17, wherein the biasing circuit further comprises a current mirror generating a bias current for current biasing the output stage, wherein the current mirror is coupled to the capacitor.

20. The method of claim 19, wherein:
the feedback elements comprise a feedback capacitor; and
the current mirror has a ratio substantially equal to that of the ratio of a capacitance of the feedback capacitor to a capacitance of the capacitor.

21. The method of claim 15, wherein the feedback elements comprise at least one of a feedback transconductance and a feedback capacitance.

* * * * *